United States Patent
Imai et al.

(10) Patent No.: US 7,417,890 B2
(45) Date of Patent: Aug. 26, 2008

(54) SEMICONDUCTOR MEMORY DEVICE

(75) Inventors: Seiro Imai, Yokohama (JP); Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 11/672,227

(22) Filed: Feb. 7, 2007

(65) Prior Publication Data

US 2007/0195584 A1 Aug. 23, 2007

(30) Foreign Application Priority Data

Feb. 9, 2006 (JP) ............................. 2006-032262

(51) Int. Cl.
*G11C 11/00* (2006.01)
(52) U.S. Cl. .............. 365/154; 365/185.26; 365/185.07
(58) Field of Classification Search ................. 365/154, 365/185.26, 185.07, 185.14, 185.28, 185.13
See application file for complete search history.

(56) References Cited

U.S. PATENT DOCUMENTS

2004/0114422 A1* 6/2004 Yabe .......................... 365/154
2005/0201144 A1* 9/2005 Kang et al. .................. 365/154

FOREIGN PATENT DOCUMENTS

JP 2002-74965 3/2002

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A semiconductor memory device is disclosed, which includes a first SRAM cell which includes cross-connected first and second inverters having first and second nodes, a first transistor connected between a first bit line and the first node and having a gate connected to a first write word line, a second transistor connected between a second bit line and the second node and having a gate connected to the first write word line, a third transistor having a gate connected to the second node, a fourth transistor connected between the first bit line and the third transistor and having a gate connected to a read word line, and a second SRAM cell which includes fifth-eighth transistors corresponding to the first-fourth transistors and has substantially the same configuration as the first SRAM, wherein the drains of the fourth and eighth transistors are connected to the first and second bit lines, respectively.

14 Claims, 4 Drawing Sheets

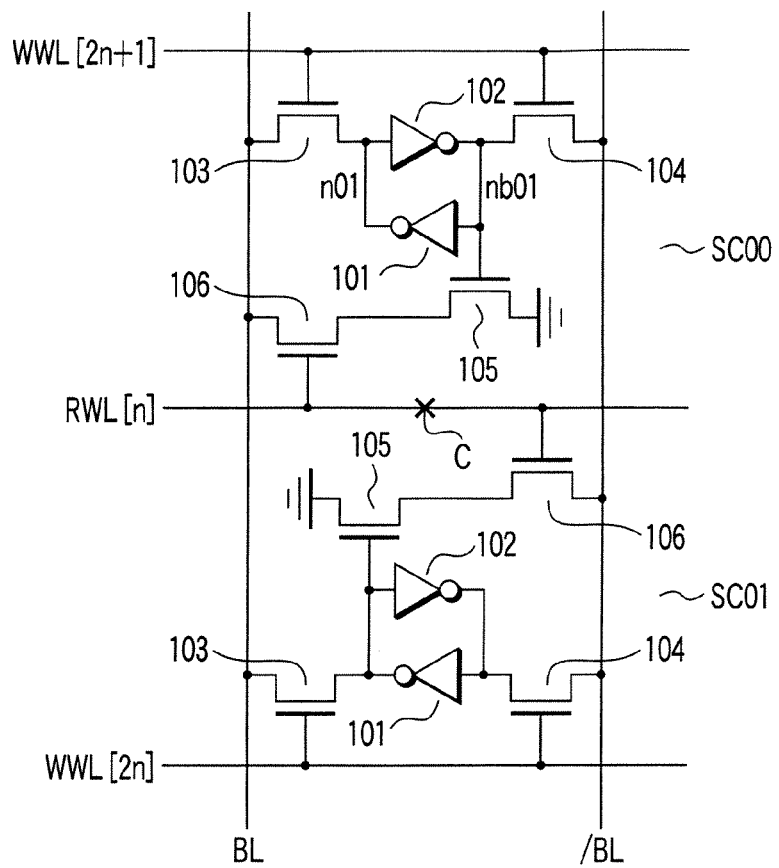
F I G. 1
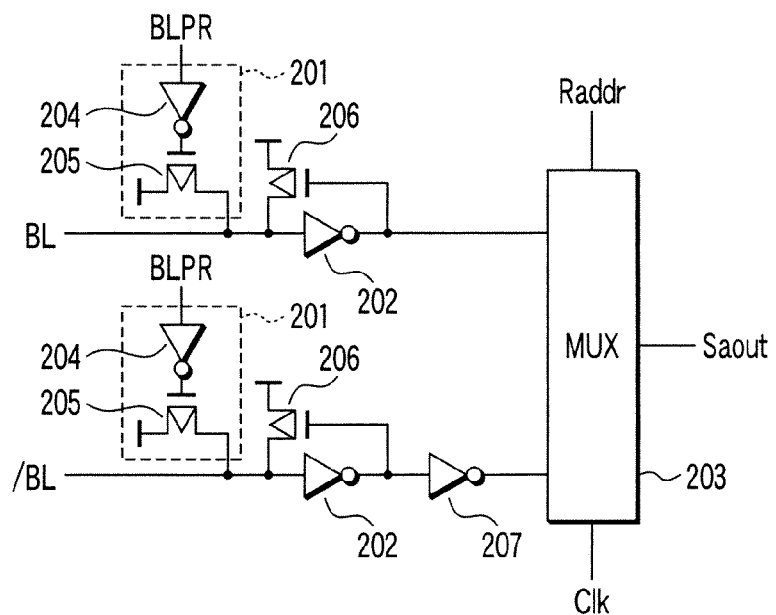
F I G. 2

US 7,417,890 B2

SEMICONDUCTOR MEMORY DEVICE

CROSS-REFERENCE TO RELATED APPLICATIONS

This application is based upon and claims the benefit of priority from prior Japanese Patent Application No. 2006-032262, filed Feb. 9, 2006, the entire contents of which are incorporated herein by reference.

BACKGROUND OF THE INVENTION

1. Field of the Invention

This invention relates to a semiconductor memory device.

2. Description of the Related Art

In recent years, transistors which configure SRAM cells are made smaller and the operation speed thereof is further enhanced as the capacity of the SRAM is increased and the operation speed thereof is further enhanced.

However, with a reduction in the size of the transistors, there occurs a problem that variation in the characteristics of the transistors configuring the SRAM cells becomes large and data of the SRAM cell is destroyed due to slight noises occurring in the SRAM cell. The main cause of generation of noises is that a leak current tends to occur due to the miniaturization of the transistors.

In order to solve the above problem, it is considered to use transistors having large channel width which are less influenced by noises. However, if the channel width of the transistor is increased, the area of the SRAM cell becomes larger and a reduction in the area of the transistors is prevented.

Therefore, a configuration having two transistors in addition to six transistors of the general configuration of an SRAM cell is proposed (for example, refer to Jpn. Pat. Appln. KOKAI Publication No. 2002-74965 [page 5, FIG. 2]). The SRAM cell has a bit line and word line for a write operation and a bit line and word line for a read operation instead of a word line and bit line of the conventional SRAM cell. By providing the write word line, read word line, write bit line and read bit line, even if transistors with small channel width are used, the SRAM cell can be less influenced. Further, since the transistor having small channel width can be used, the area of the SRAM cell can be reduced even though the number of transistors is increased by two.

However, with the recent requirement of further reducing the area of the SRAM cell, the above method of providing the word line and bit line for the write operation and the word line and bit line for the read operation delays the progress of reducing the area of the SRAM cell from the viewpoint of increasing the total number of word lines and bit lines. Thus, the above method cannot cope with a reduction in the area of the SRAM cell.

BRIEF SUMMARY OF THE INVENTION

According to an aspect of the present invention, there is provided a semiconductor memory device comprising:

a first SRAM cell which includes a first inverter, a second inverter having an input terminal connected to an output terminal of the first inverter and an output terminal connected to an input terminal of the first inverter, a first transistor having a gate connected to a first write word line, a source connected to the output terminal of the first inverter and a drain connected to a first bit line, a second transistor having a gate connected to the first write word line, a source connected to the input terminal of the first inverter and a drain connected to a second bit line, a third transistor having a gate connected to the input terminal of the first inverter and a source connected to a ground and a fourth transistor having a gate connected to a read word line and a source connected to the third transistor, and a second SRAM cell which includes a third inverter, a fourth inverter having an input terminal connected to an output terminal of the third inverter and an output terminal connected to an input terminal of the third inverter, a fifth transistor having a gate connected to a second write word line, a source connected to the output terminal of the third inverter and a drain connected to the first bit line, a sixth transistor having a gate connected to the second write word line, a source connected to the input terminal of the third inverter and a drain connected to the second bit line, a seventh transistor having a gate connected to the input terminal of the third inverter and a source connected to the ground and an eighth transistor having a source connected to the third transistor, wherein the fourth transistor of the first SRAM cell has a drain connected to the first bit line and the eighth transistor of the second SRAM cell has a drain connected to the second bit line.

BRIEF DESCRIPTION OF THE SEVERAL VIEWS OF THE DRAWING

FIG. 1 is a circuit diagram of an SRAM cell circuit which is a semiconductor memory device according to a first embodiment of the present invention.

FIG. 2 is a circuit diagram showing an example of a read circuit which reads data from the SRAM cell circuit shown in FIG. 1.

DETAILED DESCRIPTION OF THE INVENTION

Figure 3:
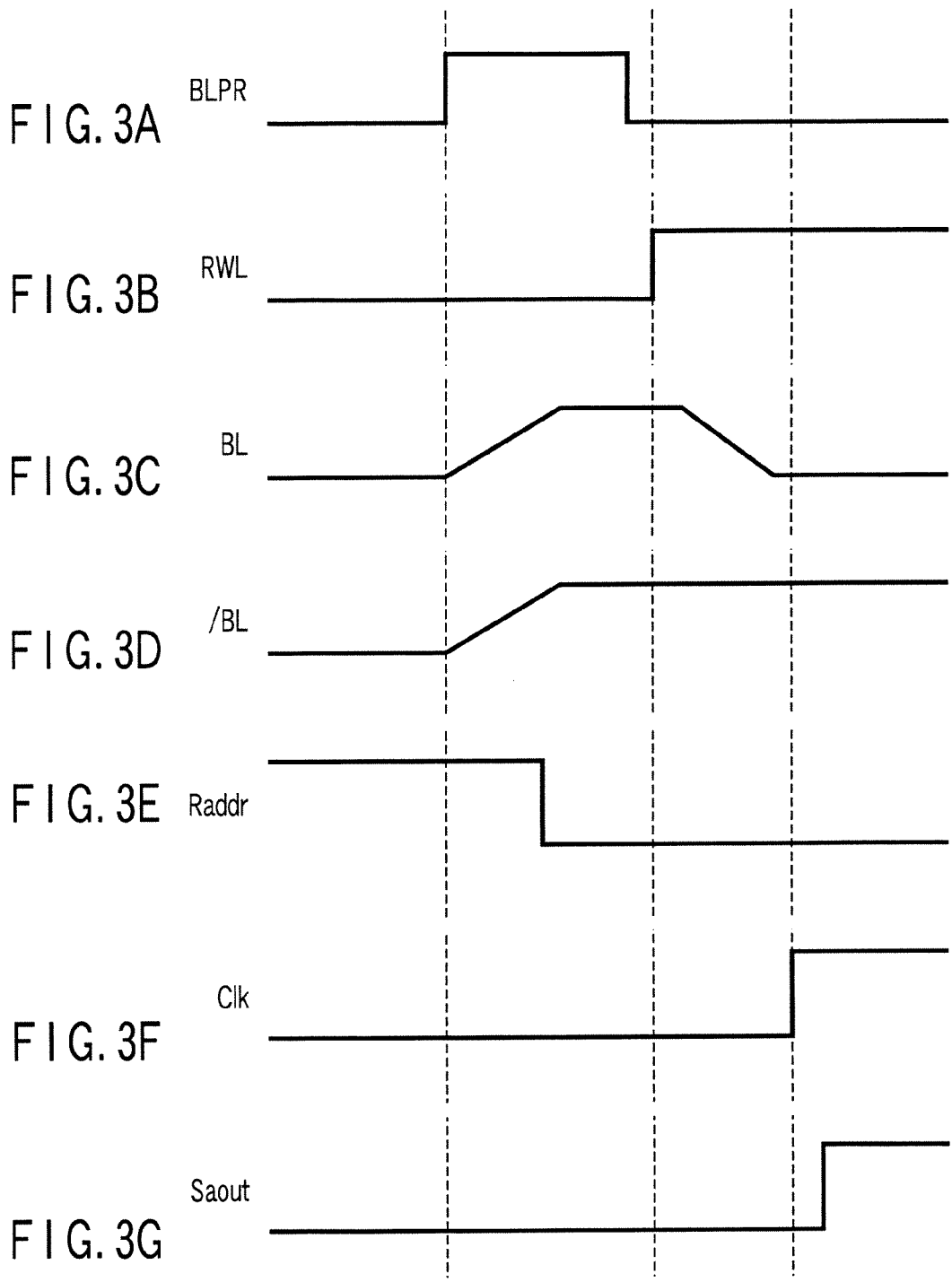
FIGS. 3A to 3G are timing charts for illustrating the operation of the SRAM cell circuit shown in FIG. 1.

There will now be described embodiments of the present invention with reference to the accompanying drawings.

First Embodiment

FIG. 1 is a circuit diagram of an SRAM cell circuit which is a semiconductor memory device according to a first embodiment of the present invention.

As shown in FIG. 1, an SRAM cell circuit of the present embodiment has a first bit line BL and second bit line /BL which form paired bit lines arranged in parallel. SRAM cells SC00 and SC01 are arranged between the first and second bit lines BL and /BL.

The SRAM cell SC00 includes a first inverter 101 configured by a PMOS transistor and NMOS transistor (not shown), a second inverter 102 configured by a PMOS transistor and NMOS transistor (not shown), a first transfer gate transistor 103 connected between an output node n01 of the first inverter 101 and the first bit line BL, a second transfer gate transistor 104 connected between an output node nb01 of the second inverter 102 and the second bit line /BL, a third transfer gate transistor 105 which is connected at one end to the ground, and a fourth transfer gate transistor 106 which is connected at one end to the bit line BL and connected at the other end to the other end of the third transfer gate transistor 105. The gates of the transfer gate transistors 103 and 104 are connected to a write word line WWL(2n+1) exclusively used for the write operation. The gate of the third transfer gate transistor 105 is connected to the output node nb01 of the second inverter 102. The gate of the transfer gate transistor 106 is connected to a read word line RWL(n) exclusively used for the read operation. Thus, the SRAM cell SC00 is configured by eight transistors in total. In this case, the first, second, third and fourth transfer gate transistors 103, 104, 105 and 106 are NMOS transistors.

The write word line WWL(2n+1) exclusively used for the write operation is formed to extend in the column direction of the SRAM cell SC00, and the first and second transfer gate transistors 103 and 104 are arranged in the column direction of the SRAM cell SC00. Also, the read word line RWL(n) exclusively used for the read operation is formed to extend in the column direction, and is connected to the fourth transfer gate transistors 106 in the column direction.

Like the SRAM cell SC00, the SRAM cell SC01 includes a first inverter 101, second inverter 102, first transfer gate transistor 103, second transfer gate transistor 104, third transfer gate transistor 105 and fourth transfer gate transistor 106. In the SRAM cell SC01, the gates of the first and second transfer gate transistors 103 and 104 are connected to a write word line WWL(2n) and the gate of the fourth transfer gate transistor 106 is connected to the read word line RWL(n). That is, the gates of the fourth transfer gate transistors 106 of the SRAM cells SC00 and SC01 are connected to the common read word line RWL(n). Further, unlike the case of the SRAM cell SC00, the fourth transfer gate transistor 106 of the SRAM cell SC01 is connected to the second bit line /BL instead of the first bit line BL. Therefore, if the read word line RWL(n) is activated in the data read mode in which data is read from the SRAM cells SC00, SC01, the fourth transfer gate transistors 106 of the SRAM cells SC00, SC01 are both set in the ON state, data in the SRAM cell SC00 is read to the first bit line BL and data in the SRAM cell SC01 is read to the second bit line /BL.

As described before, the SRAM cells SC00, SC01 have the common read word line RWL, the transfer gate transistor 106 for the read operation in the SRAM cell SC00 is connected to the first bit line BL and the transfer gate transistor 106 for the read operation in the SRAM cell SC01 is connected to the second bit line /BL. Therefore, as shown in FIG. 1, the circuit pattern of the SRAM cell SC00 and the circuit pattern of the SRAM cell SC01 are substantially symmetrically formed with the point C of the read word line RWL(n) set at the center. That is, the first, second inverters 101, 102 and the first, second, third and fourth transfer gate transistors 103, 104, 105 and 106 are set in practically a point symmetrical positional relation about the point C on the common read word line RWL(n).

The SRAM cell circuit of the present embodiment with the above configuration is subjected to the read operation by use of a read circuit shown in FIG. 2.

The read circuit shown in FIG. 2 include precharge circuits 201 which are respectively provided for the first bit line BL and second bit line /BL and respectively precharge the first bit line BL and second bit line /BL at the read operation time, inverters 202 which are respectively provided in the first bit line BL and second bit line /BL and supplied with data items read to the first bit line BL and second bit line /BL, an inverter 207 which is provided in the second bit line /BL and supplied with output data of the inverter 202 provided in the second bit line /BL, and an MUX 203 which is provided in the first bit line BL and second bit line /BL and to which output data items from the inverters 202 respectively provided in the first bit line BL and second bit line /BL are input.

The precharge circuits 201 respectively provided in the first bit line BL and second bit line /BL each include an inverter 204 supplied with a precharge signal BLPR and a PMOS transistor 205 supplied with an inverted signal of the precharge signal BLPR output from the inverter 204. The PMOS transistor 205 in the precharge circuit 201 provided in the first bit line BL has a drain connected to a power supply potential node VDD and a source connected to the first bit line BL. The PMOS transistor 205 in the precharge circuit 201 provided in the second bit line /BL has a drain connected to the power supply potential node VDD and a source connected to the second bit line /BL.

The output terminals and input terminals of the inverters 202 respectively provided in the first bit line BL and second bit line /BL are respectively connected to the gates and sources of PMOS transistors 206. The drain of the PMOS transistor is connected to the power supply potential node VDD.

The MUX 203 is supplied with data read to the first bit line BL via the inverter 202 provided in the first bit line BL. Further, the MUX 203 is supplied with data read to the second bit line /BL via the inverter 202 and inverter 207 provided in the second bit line /BL. One of the data items of the first and second bit lines BL, /BL input to the MUX 203 is selected by selecting one of the first bit line BL and second bit line /BL according to a read address signal Raddr and data of the selected bit line is output from the output terminal Saout at timing at which a clock signal Clk is input.

With the above configuration and operation of the read circuit, selected one of the data items read from the SRAM cells SC00, SC01 is output from the MUX 203.

An example of the read operation of the SRAM shown in FIG. 1 is explained with reference to FIGS. 1, 2 and 3A to 3G. FIGS. 3A to 3G are timing charts for illustrating the read operation of the SRAM in FIG. 1.

The explanation for the write operation by use of the drawings is omitted since data can be written in storage nodes n01, nb01 of the SRAM cell SC0, for example, by precharging data items which are desired to be written on the first, second bit lines BL, /BL, then setting the write word line WWL into the activated state and setting the first, second transfer gate transistors 103, 104 into the ON state as in the case of the write operation of the conventional SRAM cell.

First, it is supposed that a low signal is stored in the SRAM cell SC00 and a high signal is stored in the SRAM cell SC01 as an example of data items stored in the storage nodes of the SRAM cells SC00, SC01. Further, it is supposed that data stored in the SRAM cell SC01, that is, high is read as data to be read.

As shown in FIG. 3A, in the read operation of the SRAM cell SC01, first, a precharge signal BLPR is made high. Then, the PMOS transistors 205 respectively provided in the first, second bit lines BL, /BL are set into the ON state and the first, second bit lines BL, /BL are precharged to high as shown in FIGS. 3C and 3D, respectively.

Next, when the precharge operation for the first, second bit lines BL, /BL is completed, the precharge signal BLPR is made high and the precharge operation is terminated as shown in FIG. 3A. After this, as shown in FIG. 3B, the read word line RWL is made high and the read operation is started.

Since the read word line RWL is commonly used by the SRAM cells SC00, SC01, the fourth transfer gate transistors 106 of the SRAM cells SC00, SC01 are both set into the ON state and data items stored in the storage node n01 of the SRAM cell SC00 and the storage node nb01 of the SRAM cell SC01 are respectively read to the first, second bit lines BL, /BL. That is, as shown in FIG. 3C, low is read from the SRAM cell SC00 to the first bit line BL, and therefore, the first bit line BL is transited from high to low. Further, since high is read from the SRAM cell SC01 to the second bit line /BL, the second bit line /BL is kept high as shown in FIG. 3D.

Thus, a high output signal Saout is output from the MUX 203 at timing of the clock signal clk input to the MUX 203 as shown in FIGS. 3F and 3G by previously selecting (for example, inputting low) the second bit line /BL to which data of the SRAM cell SC01 is read by use of a read address signal Raddr as shown in FIG. 3E. Then, the read operation of the SRAM cell circuit shown in FIG. 1 is terminated.

Figure 4:
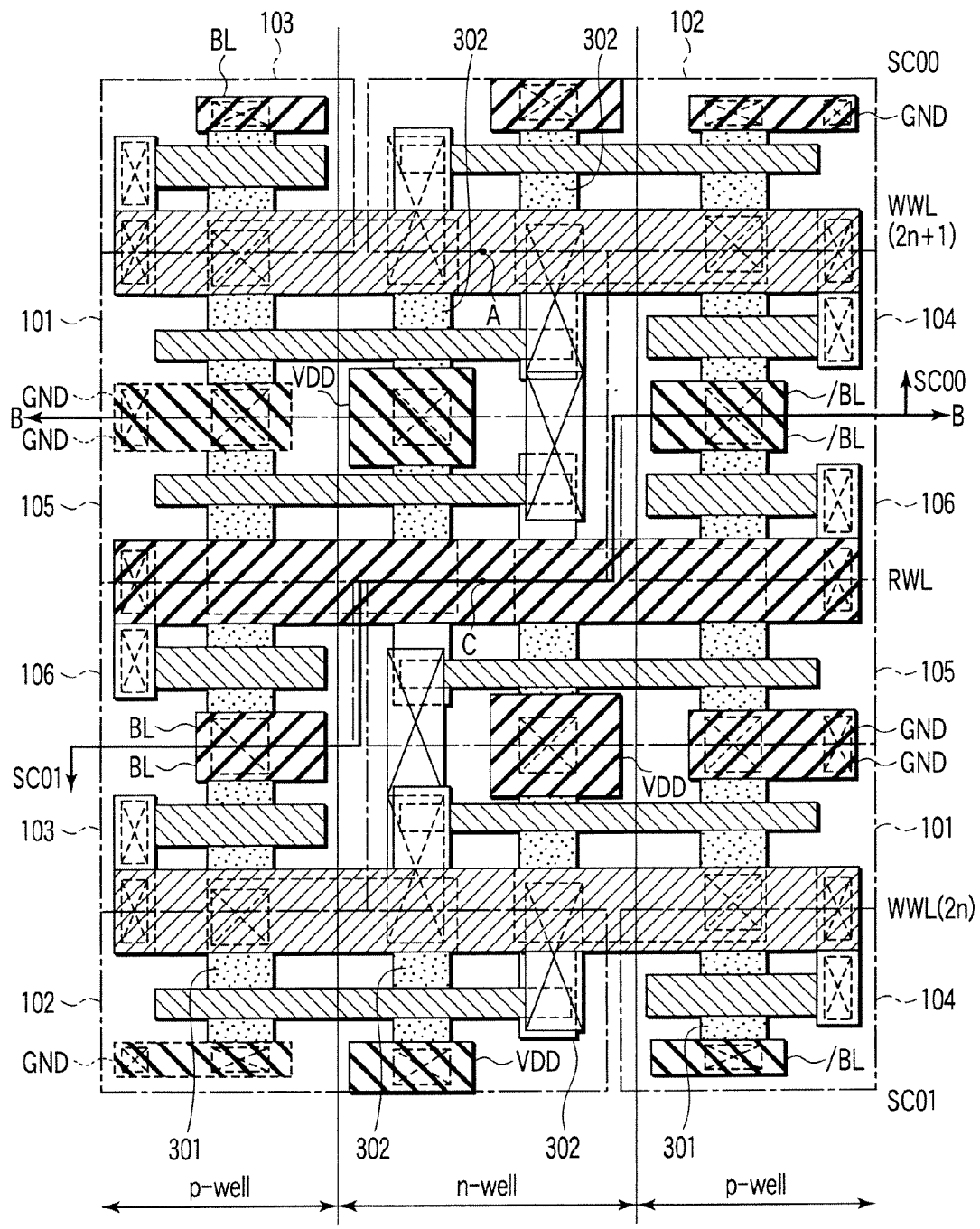
FIG. 4 is a pattern layout view of the SRAM cell circuit shown in FIG. 1.

The SRAM cell circuit of the present embodiment with the above configuration and operation is formed with a pattern layout shown in FIG. 4. In the pattern layout shown in FIG. 4, the same reference symbols are attached to constituents corresponding to the constituents shown in FIG. 1.

The layout of the SRAM cell SC00 is explained with reference to FIG. 4. In this example, n-type source/drain diffusion layers 301 are formed in respective p-type well regions and p-type source/drain diffusion layers 302 are formed in an n-type well region. The p-type well region and the n-type well region are electrically isolated from each other by use of an element isolation region (not shown) formed of an insulating layer.

A write word line WWL(2n+1) and read word line RWL are formed to intersect at right angles with the n-type source/drain diffusion layers 301 and p-type source/drain diffusion layers 302.

The first inverter 101 and second inverter 102 are set in the point-symmetrical positional relation to each other with regard to a point A on the write word line WWL(2n+1). Further, the first transfer gate transistor 103 and second transfer gate transistor 104 are set in the point-symmetrical positional relation to each other with regard to the point A on the write word line WWL(2n+1).

The third transfer gate transistor 105 and fourth transfer gate transistor 106 are set in the line-symmetrical positional relation about the B-B line to the first transfer gate transistor 103 and first inverter 101. The read word line RWL is set in the line-symmetrical positional relation about the B-B line to the write word line WWL(2n+1).

The SRAM cell SC01 has substantially the same layout as the SRAM cell SC00 and the SRAM cell SC00 and SRAM cell SC01 are set substantially in the point-symmetrical positional relation to each other with regard to a point C on the read word line RWL. That is, the fourth transfer gate transistor 106 of the SRAM cell SC01 is formed in position adjacent to the second and third transfer gate transistors 104 and 105 of the SRAM cell SC00. Further, the first, second inverters 101, 102 and the first, second, third transfer gate transistors 103, 104, 105 of the SRAM cell SC00 and SRAM cell SC01 are formed with the read word line RWL set therebetween.

The first bit line BL is connected to n-type source/drain diffusion layers 301 of the first transfer gate transistor 103 and fourth transfer gate transistor 106 of the SRAM cell SC00 and the first transfer gate transistor of the SRAM cell SC01 via contacts. The first bit line BL is formed to intersect at right angles with the write word line WWL and read word line RWL although the whole portion of the first bit line is not shown in the drawing.

The second bit line /BL is connected to n-type source/drain diffusion layers 301 of the second transfer gate transistor 104 of the SRAM cell SC00 and the second transfer gate transistor 104 and fourth transfer gate transistor 106 of the SRAM cell SC01 via contacts. The second bit line /BL is formed to intersect at right angles with the write word line WWL and read word line RWL although the whole portion of the second bit line is not shown in the drawing.

As the layout of the SRAM cell of the SRAM cell circuit shown in FIG. 4 described above, the layout configuration of the conventional SRAM cell configured by six transistors can be used as it is. That is, in the conventional SRAM cell configured by six transistors shown in FIG. 4, the gates are point-symmetrically formed to each other with regard to the point A on the word line (WWL), transfer gate transistors of a 6-TrSRAM cell are configured by the transfer gate transistors 103, 104 shown in FIG. 4 and inverters are configured by the inverters 101, 102 shown in FIG. 4. With the above configuration, one conventional SRAM cell is configured. Further, the gates and word lines of the two adjacent SRAM cells with the conventional configuration are line-symmetrically formed about the B-B line of FIG. 4. Inverters of the two adjacent SRAM cells are respectively configured by the third transfer gate transistors 105 of the SRAM cells SC00, SC01 shown in FIG. 4, transfer gate transistors of the two adjacent SRAM cells are respectively configured by the fourth transfer gate transistors 106 of the SRAM cells SC00, SC01 shown in FIG. 4 and a word line of the two adjacent SRAM cells is configured by the read word line RWL shown in FIG. 4.

In the SRAM cell circuit according to the first embodiment of the present invention, the number of read word lines can be reduced and the area thereof can be made smaller in comparison with the conventional SRAM cell circuit having read word lines for respective SRAM cells by providing the common read word line commonly used by the adjacent SRAM cells in the SRAM cells each configured by eight transistors. Further, in the SRAM cell circuit according to the first embodiment of the present invention, since data of the two adjacent SRAM cells can be read to one and the other of the bit lines BL and /BL, it is not necessary to additionally provide a read bit line, and therefore, the area thereof can be made smaller.

Further, in the SRAM cell circuit of the present embodiment, the layout of the conventional SRAM cell configured by six transistors can be used as it is by point-symmetrically arranging the two adjacent SRAM cells. Therefore, the SRAM cell circuit can be configured with the simple layout formed of only a rectangular pattern which is an advantage of the SRAM cell circuit configured by six transistors arranged in the point-symmetrical positional relation and thus miniaturization thereof can be promoted. Further, in the SRAM cell circuit of the present embodiment, data destruction due to noises caused by a leak current flowing in the transistor with miniaturization of the SRAM cell can be prevented by configuring the SRAM cell by use of eight transistors unlike the conventional case in which the SRAM cell is configured by six transistors.

Figure 5:
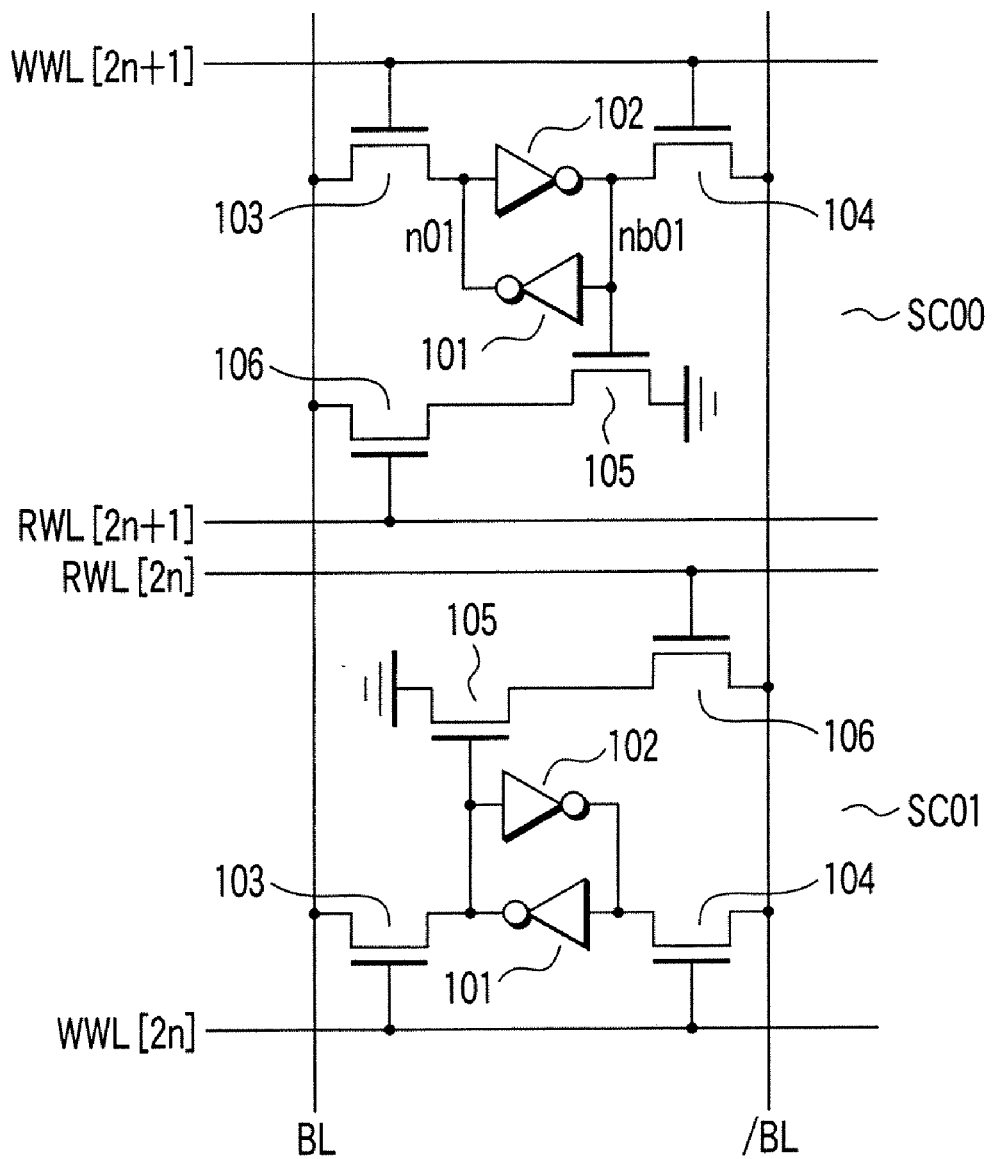
FIG. 5 is a circuit diagram of an SRAM cell circuit which is a semiconductor memory device according to a second embodiment of the present invention.

This invention is not limited to the above embodiment. For example, as the read word line RWL, the common read word line RWL for the SRAM cells SC00 and SC01 is used, however as shown in FIG. 5, it is possible to use two read word lines between the SRAM cells SC00 and SC01.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first SRAM cell which includes a first inverter, a second inverter having an input terminal connected to an output terminal of the first inverter and an output terminal connected to an input terminal of the first inverter, a first transistor having a gate connected to a first write word line, a source connected to the output terminal of the first inverter and a drain connected to a first bit line, a second transistor having a gate connected to the first write word line, a source connected to the input terminal of the first inverter and a drain connected to a second bit line, a third transistor having a gate connected to the input terminal of the first inverter and a source connected to a ground and a fourth transistor having a gate connected to a read word line and a source connected to the third transistor, and
a second SRAM cell which includes a third inverter, a fourth inverter having an input terminal connected to an output terminal of the third inverter and an output terminal connected to an input terminal of the third inverter, a fifth transistor having a gate connected to a second write word line, a source connected to the output terminal of the third inverter and a drain connected to the first bit line, a sixth transistor having a gate connected to the second write word line, a source connected to the input terminal of the third inverter and a drain connected to the second bit line, a seventh transistor having a gate connected to the output terminal of the third inverter and a source connected to the ground and an eighth transistor having a source connected to the seventh transistor,
wherein the fourth transistor of the first SRAM cell has a drain connected to the first bit line and the eighth transistor of the second SRAM cell has a drain connected to the second bit line.

2. The semiconductor memory device according to claim 1, wherein the eighth transistor has a gate connected to the read word line.

3. The semiconductor memory device according to claim 1, wherein data of the first SRAM cell is read to the first bit line and data of the second SRAM cell is read to the second bit line at the read time.

4. The semiconductor memory device according to claim 3, further comprising a circuit which functions to select one of data read to the first and second bit lines at the read time and output selected one of the read data.

5. The semiconductor memory device according to claim 1, wherein the first and second SRAM cells are arranged in a point-symmetrical relation to each other with regard to a point on the read word line.

6. The semiconductor memory device according to claim 1, wherein the gates of the first to eighth transistors and the first and second inverters are arranged in parallel one from another and the source/drain regions of the first to eighth transistors and the first and second inverters are arranged to intersect at right angles with the gates of the first to eighth transistors and the first and second inverters.

7. The semiconductor memory device according to claim 1, wherein the first write word line, second write word line and read word line are arranged in parallel to the gates of the first to eighth transistors and the first and second inverters.

8. The semiconductor memory device according to claim 1, wherein the first write word line, second write word line and read word line are arranged to intersect at right angles with the first and second bit lines.

9. The semiconductor memory device according to claim 1, wherein the gate of the first transistor and the gate of the second inverter are arranged on a straight line in a first write word line direction, the first and second transistors are set in a point-symmetrical relation to each other with regard to a point of the first write word line, and the first and second inverters are set in a point-symmetrical relation to each other with regard to the point on the first write word line.

10. The semiconductor memory device according to claim 1, wherein the first inverter and third transistor are arranged in an adjacent position and the first inverter, first transistor and first write word line are arranged in a line-symmetrical relation to the third transistor, fourth transistor and read word line.

11. The semiconductor memory device according to claim 1, wherein the gate of the third transistor and the gate of the eighth transistor are arranged on a straight line in a read word line direction, the third and seventh transistors are set in a point-symmetrical relation to each other with regard to a point on the read word line, and the fourth and eighth transistors are set in a point-symmetrical relation to each other with regard to the point on the read word line.

12. The semiconductor memory device according to claim 1, wherein the seventh transistor and third inverter are arranged in an adjacent position and the third transistor, fourth transistor, eighth transistor, seventh transistor and read word line are arranged in a line-symmetrical relation to the fourth inverter, fifth transistor, sixth transistor and second write word line.

13. The semiconductor memory device according to claim 1, further comprising a read circuit which includes:
a precharge circuit which is provided for the first bit line and second bit line and precharges the first bit line and second bit line at read operation;
a fifth inverter which is provided for the first bit line and inputted with data read to the first bit line;
a sixth inverter which is provided for the second bit line and inputted with data read to the second bit line;
a seventh inverter which is provided for the second bit line and inputted with output data of the sixth inverter; and
a multiplexer which is inputted with output data of the fifth inverter and output data of the seventh inverter.

14. The semiconductor memory device according to claim 13, wherein the multiplexer of the read circuit selects one of the first bit line and the second bit line in accordance with an read address signal and outputs data of a selected one of the first bit line and the second bit line.

* * * * *